United States Patent
Mastrangelo et al.

(10) Patent No.: US 7,180,786 B2
(45) Date of Patent: Feb. 20, 2007

(54) ROW DECODER FOR NAND MEMORIES

(75) Inventors: Raffaele Mastrangelo, Anastasia (IT); Carlo Borromeo, Napoli (IT)

(73) Assignee: STMicroelectronics, S.R.L. (IT)

( * ) Notice: Subject to any disclaimer, the term of this patent is extended or adjusted under 35 U.S.C. 154(b) by 0 days.

(21) Appl. No.: 11/202,632

(22) Filed: Aug. 11, 2005

(65) Prior Publication Data
US 2006/0050575 A1   Mar. 9, 2006

(30) Foreign Application Priority Data
Aug. 11, 2004 (EP) .................................. 04425626

(51) Int. Cl.
*G11C 16/06* (2006.01)
(52) U.S. Cl. ........................... 365/185.23; 365/185.24; 365/185.25
(58) Field of Classification Search ........... 365/185.23, 365/185.24, 185.25, 185.17, 201, 230.06
See application file for complete search history.

(56) References Cited

U.S. PATENT DOCUMENTS 6,072,719 A * 6/2000 Tanzawa et al. ....... 365/185.03
6,144,592 A   11/2000 Kanda
6,154,409 A * 11/2000 Huang et al. ............... 365/222
6,249,479 B1* 6/2001 Tanzawa et al. ....... 365/230.06

FOREIGN PATENT DOCUMENTS

DE          4446998          6/1999

OTHER PUBLICATIONS

European Search Report, EP 04425626, Dec. 10, 2004.

* cited by examiner

*Primary Examiner*—Gene N. Auduong
(74) *Attorney, Agent, or Firm*—Lisa K. Jorgenson; Paul F. Rusyn; Graybeal Jackson Haley LLP

(57) ABSTRACT

A row decoder for an electrically programmable NAND memory further includes a first means for keeping at least a control node of an addressed memory block charged at a select voltage. A second means decouples all select lines from a global select line. A third means provides an access voltage to the select line corresponding to an addressed memory block for enabling respective access elements and for providing an access inhibition voltage to the select lines corresponding to a non-addressed memory block. The first, second and third means are activatable in a testing operation.

20 Claims, 2 Drawing Sheets

ROW DECODER FOR NAND MEMORIES

PRIORITY CLAIM

This application claims priority from European patent application No. 04425626.1, filed Aug. 11, 2004, which is incorporated herein by reference.

TECHNICAL FIELD

The present invention generally relates to the field of solid-state memories, particularly to semiconductor memories and, even more particularly, to the field of non-volatile memories. Specifically, the invention relates to non-volatile memories that are electrically programmable.

BACKGROUND

Non-volatile memories are commonly used in several applications when the data stored in the memory need to be preserved even in absence of a power supply. Within the class of non-volatile memories, electrically programmable (and erasable) memories, such as flash memories, have become very popular in applications in which the data to be stored are not immutable (as it might be case of, e.g., a consolidated code for a microprocessor), being instead necessary from time to time to store new data, or to update the data already stored. Examples of such applications include memory cards of the type used for example in digital cameras.

Typically, the memory includes an arrangement of memory cells, disposed for example in rows and columns, so as to form a matrix. Depending on the way the memory cells in the matrix are interconnected, a so-called NAND architecture for the flash memories can be identified. Roughly speaking in a NAND architecture groups of memory cells of a same matrix column are serially interconnected so as to form respective strings, which strings are then connected in parallel to each other to a same bit line. NAND flash memories are compact (a low number of contacts in the matrix are required), and they are suited for applications such as file storage.

In the NAND architecture, the memory space is partitioned into a plurality of memory blocks or sectors, each memory block including a plurality of memory cell strings connected between two common select lines. Each row of memory cells is in turn connected to a respective word line and then each memory block is associated with a number of word lines equal to the number of memory cells in one string. In order to access a memory cell for a read or a write operation, or even for testing it, the corresponding word line and bit line have to be properly biased together with the two select lines of the respective memory block.

For accessing a desired memory location an external device provides an address to the NAND memory; a first address portion corresponds to the memory block and a second address portion corresponds to the word line containing the addressed memory location. The NAND memory includes a row decoder receiving the address and, in turn, the row decoder includes a block decoder for addressing the desired memory block in response to the decoding of the block address portion and a word line decoder for properly biasing the word lines and the two select lines in response to the decoding of the word line address portion.

Typically, for saving occupied semiconductor area a word line decoder is connected to two global select lines and to global word lines, in turn connectable to the two select lines and to the word lines of the selected block, respectively, by means of respective pass transistors controlled by the block decoder. In detail, the block decoder allows connecting the two select lines and the word lines of the desired memory block to the global lines properly biased by the word line decoder. Then, the word line decoder comprises one driver for each global line instead of one driver for each line controlling the access to the memory cells. In addition, for each memory block the row decoder usually includes control units, receiving decoding signals corresponding to the block address portion and, accordingly, providing signals taking voltage values suitable for the required operations on the NAND memory, such as the value of a supply voltage or the value of a voltage bootstrapped with respect to the supply voltage. In detail, the gate terminals of the pass transistors corresponding to each memory block are connected to a common node biased by a respective control unit. Such a structure permits implementation of a row decoder occupying a relatively small area in accordance to the compact architecture of the NAND memories.

In solutions known in the art, the selection of the desired location includes precharging the common nodes connected to the gate terminals of all the pass transistors at the bootstrapped voltage; after the precharge, the common nodes corresponding to the memory blocks not addressed are discharged to a voltage suitable to keep the word lines and the select lines disconnected from the word line decoder, i.e. to keep the pass transistors switched off. Instead, the common node corresponding to the addressed memory block kept floating at the bootstrapped voltage for the duration of the required operation.

Inevitably, the common node left floating in turn tends to discharge from the bootstrapped voltage because of leakages and, accordingly, the duration of an operation on the NAND memory has to be limited to a relatively short time. This is not a problem for operations, such as a read or a write operation, having typical durations about from ten to thirty microseconds, but there are operations, such as operations in test mode, which can require periods of the order of tens of milliseconds.

An example of operation in test mode is the so-called Direct Memory Access (DMA); in a DMA phase the bit lines are directly connected to respective input/output pads of the memory device biased to a suitable voltage, while the voltage at the word lines is varied by the word line decoder. Particularly, a memory cell is accessed in DMA for sensing the current sunk thereby, by means of an external testing device connected to the corresponding input/output pad. Accordingly, the DMA permits to identify defective memory cells and, in addition to characterize the memory cells, for example to obtain a threshold voltage distribution.

As a consequence, a discharge of the floating common node corresponding to the selected block makes unreliable, if not unfeasible, the current sensing in DMA mode because of the relatively long duration thereof.

In view of the state of the art outlined in the foregoing, one of the problems that the Applicant has faced has been how to provide a row decoder for NAND memories which permits performance in a reliable way, in particular without impacting on the compactness of the NAND memories, operations necessitating relatively long times, during which the word lines and the select lines of the selected block should be kept driven by the row decoder, particularly operations requiring times longer than typical times required by read and write operations, such as in a DMA operation.

SUMMARY

According to an aspect of the present invention, a row decoder for a NAND memory is provided.

According to one aspect of the present invention, a row decoder for an electrically programmable NAND memory is provided, the NAND memory including an array of a plurality of memory cells arranged in a plurality of rows, said memory cells being grouped into a plurality of memory blocks each one including a plurality of strings of memory cells, and each string including at least one access element for coupling the string to a respective bit line, the access elements of the strings of a respective memory block being controlled by a respective select line, the row decoder including: a global select line selectively couplable to the select line corresponding to an addressed memory block; switching means for each memory block for selectively coupling the global select line to the select line, the switching means having a respective control node; and precharging means for precharging to a select voltage the control nodes, the precharging means being activatable in a testing operation, particularly an operation of direct memory access to a memory cell, for precharging all the control nodes to the select voltage adapted to cause the coupling of the global select line to the select lines, wherein the row decoder further includes: first means for keeping at least the control node of the addressed memory block charged at said select voltage; second means for decoupling all the select lines from the global select line; and third means for providing an access voltage to the select line corresponding to the addressed memory block for enabling the respective access elements and for providing an access inhibition voltage to the select lines corresponding to the non-addressed memory block, the first, second and third means being activatable in the testing operation.

According to another aspect of the present invention, a method of testing a memory cell is further provided.

BRIEF DESCRIPTION OF THE DRAWINGS

The features and the advantages of the present invention will be made apparent by the following description of a preferred embodiment thereof, provided merely by way of non-limitative example, description that will be conducted making reference to the attached figures, in which.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
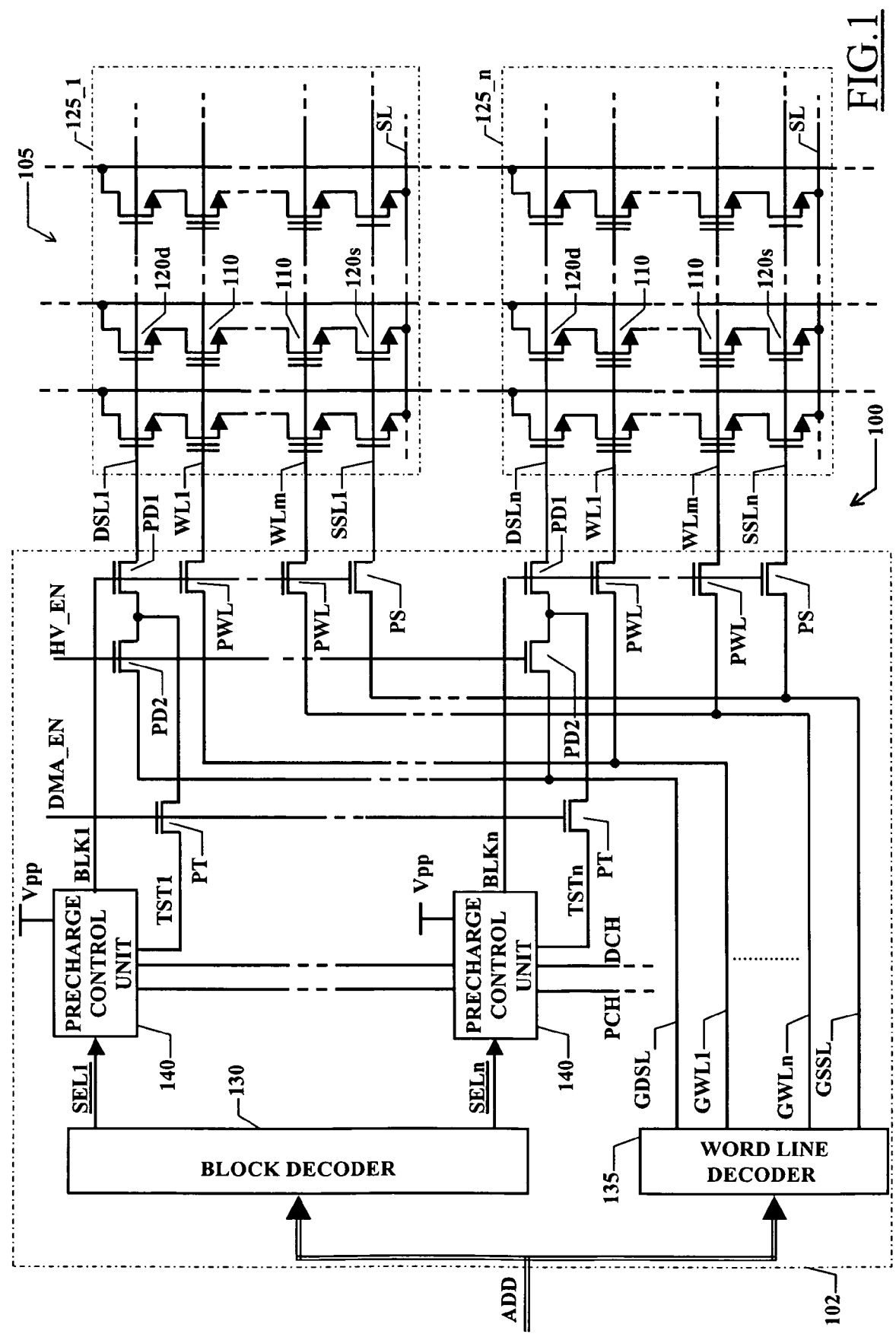
FIG. 1 shows schematically a NAND memory including a row decoder according to an embodiment of the present invention.

With reference to the drawings, FIG. 1 shows schematically a non-volatile semiconductor memory 100 including a row decoder 102 according to an embodiment of the present invention. The non-volatile semiconductor memory 100 particularly is an electrically-programmable, non-volatile semiconductor memory, such as a flash memory, integrated in a chip of semiconductor material and including an arrangement 105 of a plurality of memory cells 110 having a so-called NAND architecture.

Typically, each memory cell 110 consists of an N-channel MOS transistor having a charge-storage element, such as a conductive floating gate adapted to be charged by injected electrons. Without entering into excessive details, well known to those skilled in the art, in an erased condition (associated by convention with a logic value '1'), the memory cell 110 has a low threshold voltage value. The memory cell 110 is programmed by injecting electric charges into its floating gate: in the programmed condition (associated by convention with a logic value '0'), the memory cell 110 has a high threshold voltage value. Therefore, when a selected memory cell 110 is biased for reading its content, the memory cell 110 will be conductive if erased or non-conductive if programmed.

The NAND arrangement 105 of the plurality of memory cells 110 consists of a matrix having a plurality of columns (for example, 8192 columns) and a plurality of rows (for example, 2048 rows).

In the NAND memory matrix 105, groups of m memory cells 110 (where m is equal, e.g., to sixteen or thirty-two) are connected in series to each other to form a respective memory cells string, and different memory cell strings belonging to a same matrix column are connected in parallel to each other to a same bit line BL.

The m memory cells 110 of a generic string are in particular connected in series between a source select N-channel MOS transistor 120s and a drain select N-channel MOS transistor 120d. A generic, intermediate memory cell 110 in the memory cells string has the drain terminal connected to the source terminal of an adjacent memory cell 110, and the source terminal connected to the drain terminal of another adjacent memory cell 110. One of the two end memory cells 110 located at the ends of the string has the drain terminal connected to the source terminal of the drain select transistor 120d; the drain terminal of the drain select transistor 120d is connected to the corresponding bit line BL, as well as to the drain terminal of the corresponding drain select transistor 120d of an adjacent memory cells string. Likewise, the other end memory cell 110 of the string has the source terminal connected to the drain terminal of the source select transistor 120s; the source terminal of the source select transistor 120s is connected to the source terminal of the corresponding source select transistor 120s of another adjacent memory cells string.

The control gate terminals of the memory cells 110 in each row are connected to a corresponding word line WL1-WLm, particularly each one of the m memory cells 110 of a generic string is connected to a respective one of m word lines WL1-WLm. The gate terminals of the drain select transistors 120d belonging to a common row of the memory matrix 105 are all connected to a corresponding drain select line DSL1-DSLn; similarly, the gate terminals of the source select transistors 120s belonging to a common row are all connected to a corresponding source select line SSL1-SSLn. The drain terminals of the drain select transistors 120d belonging to a common column of the memory matrix 105 are connected to a corresponding bit line BL. Conversely, the source terminals of all the source select transistors 120s in the memory matrix 105 are connected to a common source line SL (which is typically kept at a reference voltage, or ground).

The memory cells 110 of the NAND matrix 105 are partitioned into a number n of memory blocks 125_1-125_n. Each memory block 125_1-125_n includes the same number of columns of the matrix 105 and a number of rows equal to the number m of memory cells 110 included in a string; in detail, each memory block 125_1-125_n includes the plurality of memory cell strings connected between a respective drain select line DSL1-DSLn and a respective source select line SSL1-SSLn. In this way, in a generic memory block 125_k (where k is an index, k=1, ..., n) the memory cells 110 are connected to m respective word lines WL1-WLm, the alignment of the drain select transistors 120d is connected to a respective drain select line DSLk and the alignment of source select transistors 120s is connected to a respective source select line SSLk.

The operation of the flash memory 100 is generally managed by a memory control unit, for example an on-chip microcontroller, not shown in the drawing for simplicity of illustration.

An address ADD is provided to the row decoder 102 of the flash memory 100 for selecting a desired location of the memory matrix 105, for example, a memory cell 110 in a string to be tested. Particularly, two portions can be distinguished in the address ADD, i.e. a first portion indicative of the memory block 125_1-125_n including the memory cell 110 to be selected and a second portion indicative of the word line WL1-WLm to be addressed inside the memory block 125_1-125_n. Accordingly, the row decoder 102 includes a block decoder 130, receiving the first portion of the address ADD, and a word line decoder 135, receiving the second portion.

The block decoder 130 decodes the first portion of the address ADD and provides n corresponding selection signals SEL1-SELn, each one associated with a respective memory block 125_1-125_n. When the selection signal SEL1-SELn is de-asserted (i.e., for example, taking the value of a supply voltage Vdd of the flash memory 100, e.g. 3 V), the associated memory block 125_1-125_n is not addressed; when the selection signal SEL1-SELn is asserted (i.e., for example, taking the ground voltage value), the associated memory block 125_1-125_n is addressed. It has to be observed that only one of the selection signals SEL1-SELn is normally asserted at a time.

The row decoder 102 further includes n precharge control units 140, each one receiving a respective selection signal SEL1-SELn, a precharge signal PCH, a discharge signal DCH and a bootstrapped voltage Vpp provided by a bootstrapped voltage supply line Vpp, the precharge signal PCH, the discharge signal DCH and the bootstrapped voltage Vpp being common to all the precharge control units 140; the bootstrapped voltage Vpp can be for example generated on-chip by charge pumps (not shown in the drawing). In response to the received signals the precharge control units 140 provide respective control signals BLK1-BLKn and respective test selection signals TST1-TSTn, both associated with a respective memory block 125_1-125_n. The control signal BLK1-BLKn is asserted, i.e. taking a value equal to, or even greater than, the bootstrapped voltage Vpp for selecting the associated memory block; when de-asserted the control signal BLK1-BLKn takes a value equal to the ground voltage. The test selection signal TST1-TSTn is asserted, i.e. taking a value equal to the supply voltage Vdd, when the respective selection signal SEL1-SELn is asserted, and it is de-asserted, i.e. taking a value equal to the ground, when the respective selection signal SEL1-SELn is de-asserted. The selection signals SEL1-SELn are underlined to indicate that they take the ground voltage value when asserted and the supply voltage value when de-asserted, contrary to the corresponding test selection signals TST1-TSTn.

The word line decoder 135 drives m global word lines GWL1-GWLm connectable to the m word lines WL1-WLm of the addressed block 125_1-125_n, respectively. In addition, the word line decoder 135 further drives a global drain select line GDSL and a global source select line GSSL connectable to the drain select line DSL1-DSLn and to the source select line SSL1-SSLn of the addressed memory block 125_1-125_n, respectively. The word line decoder 135 decodes the second portion of the address ADD for biasing the global lines GWL1-GWLm, DSL1-DSLn and SSL1-SSLn to corresponding voltages.

In greater detail, in order to access a given memory cell 110 for sensing a current flowing therethrough, the drain select transistor 120d and the source select transistor 120s in the memory cells string to which the cell belongs are turned on; for this purpose the drain select line DSL1-DSLn and the source select line SSL1-SSLn of the addressed block 125_1-125_n, for example, are brought to a voltage equal to the supply voltage Vdd of the flash memory 100. The bit line BL to which there is connected the string containing the memory cell 110 to be sensed is selected by a bit line selector (not shown in the drawing) or, for example during a DMA test phase, is directly connected to an input/output pad of the flash memory 100 and brought to a suitable voltage (such as, 1 V). The word line WL1-WLm to which the selected memory cell belongs, for example the word line WL3 in the memory block 125_2, is brought to a voltage intermediate between the erased threshold voltage value and the programmed threshold voltage value (e.g., ground). The remaining word lines WL1-WLm of the memory block 125_2, in the considered example the word lines WL1, WL2 and WL4-WLm, controlling the gates of the other memory cells 110 of the same string, are all brought to a potential sufficiently high to ensure that these memory cells 110 are turned on irrespective of their programming state (for example, a voltage approximately between 4.5 V and 10 V). All the other word lines WL1-WLm associated with the memory cells strings of the memory blocks 125_1 and 125_3-125_n not addressed are, for example, kept floating.

The word lines WL1-WLm are connectable to the global word lines GWL1-GWLm by means of respective n-MOS transistors PWL, acting as pass transistors; in detail, each pass transistor PWL has a first source/drain terminal connected to the respective word line WL1-WLm and a second source/drain terminal connected to the corresponding global word line GWL1-GWLm. In this way, each global word line GWL1-GWLm is connectable to a selected one of n respective word lines WL1-WLm, one for each memory block 125_1-125_n, by means of respective n pass transistors PWL. The gate terminals of the pass transistors PWL connected to the word lines WL1-WLm of a respective memory block 125_1-125_n receive the respective control signal BLK1-BLKn.

Similarly, each one of the n source select lines SSL1-SSLn is connectable to the global source select line GSSL by means of a pass transistor PS, having a first source/drain terminal connected to the respective source select line SSL1-SSLm and a second source/drain terminal connected to the global source select line GSSL.

In the embodiment of the present invention herein described each one of the n drain select lines DSL1-DSLn is connectable to the global drain select line GDSL by means of a first pass transistor PD1 and a second pass transistor PD2. The first pass transistor PD1 has a first source/drain terminal connected to the respective drain select line DSL1-DSLm and a second source/drain terminal connected to a first source/drain terminal of the second pass transistor PD2, which in turn has a second source/drain terminal connected to the global source select line GSSL. Also the gate terminals of the first pass transistor PD1 connected to the respective drain select line DSL1-DSLm and of the pass transistor PS connected to the respective source select line SSL1-SSLm receive the control signal BLK1-BLKn associated with the respective memory block 125_1-125_n.

The gate terminals of the second pass transistors PD2 receives an operation enabling signal HV_EN, asserted (i.e., for example, taking the bootstrapped voltage Vpp) for switching the second pass transistors PD2 on during an operation on the flash memory 100, and de-asserted (i.e., for example, taking the ground voltage) for switching the second pass transistors PD2 off during a DMA phase.

In the described embodiment of the present invention each drain select line DSL1-DSLn is connected to a further pass transistor PT for receiving a respective test selection signal TST1-TSTn during the DMA phase; hereinafter the pass transistor PT is referred to as test pass transistor. In detail, the test pass transistor PT has a first source/drain terminal connected to the respective drain select line DSL1-DSLn and a second source/drain terminal connected to the block decoder 130 for receiving the respective test selection signal TST1-TSTn. The gate terminal of each test pass transistor PT receives a test enabling signal DMA_EN asserted (i.e., for example, taking a value equal to the supply voltage Vdd plus the threshold voltage Vth of the test pass transistor PT) for switching the test pass transistor PT on during a DMA phase, and de-asserted (i.e., for example, taking the ground voltage value) for switching the test pass transistor PT off during an operation on the flash memory 100.

During a DMA phase a single memory cell 110 per bit line BL is accessed to be tested and the corresponding bit line BL is directly connected to an input/output pad of the flash memory 100, biased to a suitable voltage, such as about 1 V.

The precharge signal PCH is kept asserted, and the discharge signal DCH de-asserted, for the duration of the DMA test, and all the control signals BLK1-BLKn are charged at the bootstrapped voltage Vpp. In this way, all the pass transistors PWL and PS turn on connecting the word lines WL1-WLm of all the memory blocks 125_1-125_n to the respective global word lines GWL1-GWLm and all the source select lines SSL1-SSLn to the global source selected line GSSL.

It has to be observed that the control signals BLK1-BLKn can advantageously reach a voltage value greater than the bootstrapped voltage Vpp thanks to a self-boot action of the charge of a stray capacitance between the gate terminal of the pass-transistors PWL, PS and PD1, when switched on, and the global lines GWL1-GWLm, GSSL and GDSL. In detail, when the global lines GWL1-GWLm, GSSL and GDSL are biased to a desired voltage by the word line decoder 135, the charged stray capacitances bring the control signals BLK1-BLKn to a corresponding higher voltage value.

The operation enabling signal HV_EN is de-asserted in such a way as to switch the pass transistor PD2 off for disconnecting the drain select lines DSL1-DSLn from the global drain select line GDSL and for keeping them isolated from each other. Instead the test enabling signal DMA_EN is asserted for switching all the test pass transistors PT on and for providing the test selection signals TST1-TSTn to the respective drain select line DSL1-DSLn.

After the decoding of the address ADD only one of the selection signals SEL1-SELn is asserted, and, accordingly, only one of the test selection signals TST1-TSTn is asserted. In this way, only the drain select line DSL1-DSLn of the addressed memory block 125_1-125_n is brought to the supply voltage Vdd.

The word lines WL1-WLm of all the memory blocks 125_1-125_n are biased to voltages suitable to sense a current sunk by a memory cell 110, but, according to this embodiment of the present invention, only one string is made conductive by means of the selection of the corresponding drain select line DSL1-DSLn.

As a consequence, through the input/output pad directly connected to the selected bit line BL an external testing device (not shown in the drawing) can measure the current sunk by the memory cell 110 to be tested, while a voltage at the corresponding word line WL1-WLm is varied by the word line decoder 135. Thanks to the measure of the memory cell current, the external test device can characterize the memory cell 110, evaluate the corresponding threshold voltage and find defective memory cells 110.

During an operation on the flash memory 100, such as a read or write operation, the precharge signal PCH is initially asserted for precharging all the control signals BLK1-BLKn to the bootstrapped voltage Vpp, and, accordingly all the pass transistors PD1, PWL and PS are initially switched on. The test enabling signal DMA_EN is de-asserted in order to keep the test pass transistor PT switched off and the operation enabling signal HV_EN instead is asserted in order to connect the drain select lines DSL1-DSLn to the global drain select line GDSL by means of all the pass transistors PD2 switched on.

Then, the precharge signal PCH is de-asserted and the discharge signal DCH asserted; in accordance to the decoding of the address ADD (i.e. in accordance to the asserted selection signal SEL1-SELn) only the control signal BLK1-BLKn associated with the addressed memory block 125_1-125_n is kept floating at the bootstrapped voltage Vpp, while the other control signals BLK1-BLKn are brought to the ground voltage. Accordingly, only the pass transistors PD1, PWL and PS of the addressed memory block 125_1-125_n are kept switched on connecting the corresponding drain select line DSL1-DSLn, word lines WL1-WLm and source select line SSL1-SSLn to the global drain select line GDSL, word lines GWL1-GWLm and source select line GSSL, respectively, properly biased for the operation to be performed.

Figure 2:
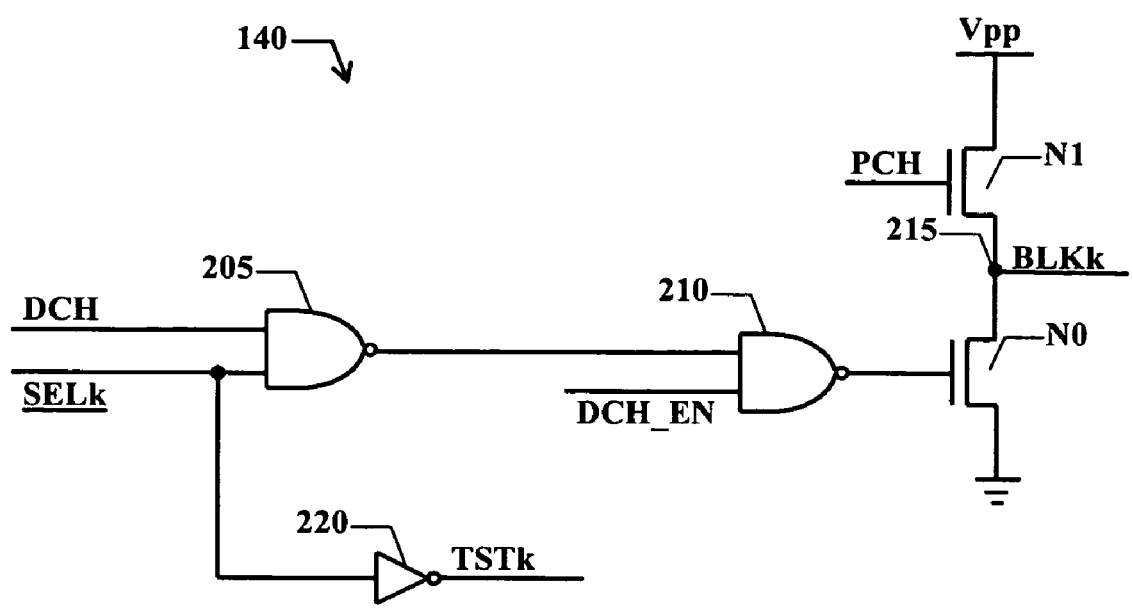
FIG. 2 shows in detail an exemplifying implementation of a precharge control unit included in the row decoder of FIG. 1.

Consider now FIG. 2, a sample implementation of one of the precharge control units 140 is shown.

The precharge control unit 140 includes a two-input NAND logic gate 205 receiving the discharge signal DCH and the generic selection signal SELk. An output of the NAND gate 205 is connected to a further two-input NAND logic gate 210, which in addition receives a discharge enabling signal DCH_EN asserted, i.e. taking a value equal to the supply voltage Vdd.

The precharge control unit 140 further includes two n-MOS transistors N0 and N1; the drain terminal of the transistor N0 is connected to the source terminal of the transistor N1 so as to define a node 215 providing the generic control signal BLKk. The source terminal of the transistor N0 is connected to ground and the drain terminal of the transistor N1 receives the bootstrapped voltage Vpp. The gate terminal of the transistor N0 is connected to the output of the NAND gate 210, while the gate terminal of the transistor N1 receives the precharge signal PCH.

Furthermore, the precharge control unit 140 included in the row decoder according an embodiment of the present invention includes a NOT logic gate 220 receiving the selection signal SELk and providing the test selection signal TSTk.

During a DMA phase the discharge signal DCH is de-asserted (taking a voltage value corresponding to a low logic value '0') and, accordingly, the NAND gate 205 outputs a high logic value '1', irrespective of the logic value taken by the selection signal SELk, and the NAND gate 210 outputs a low logic value '0' (the ground voltage value) keeping the transistor N0 off.

The precharge signal PCH is instead asserted (taking a value equal to the bootstrapped voltage Vpp plus the threshold voltage of the transistor N1) and the control signal BLKk is brought to the bootstrapped voltage Vpp irrespective of the value taken by the selection signal SELk.

If the selection signal SELk takes the low logic value '0' (i.e. if the corresponding memory block has to be accessed), the test selection signal TSTk is brought to the high logic value '1', then biasing the drain select line to a voltage suitable for accessing the desired memory cell. If the selection signal SELk takes the high logic value '1' (de-asserted), the test selection signal TSTk is brought to the low logic value '0' and, then, the strings of the memory block are kept isolated from the bit lines BL.

During an operation on the flash memory 100, such as a read or a write operation, the discharge signal DCH is only initially de-asserted and, accordingly, irrespective of the logic value taken by the selection signal SELk, the NAND gate 210 keeps initially the transistor N0 off.

The precharge signal PCH is asserted so as to precharge the node 215 to the bootstrapped voltage Vpp and then de-asserted so as to keep the node 215 disconnected from the bootstrapped voltage supply line Vpp.

Successively, the discharge signal DCH is asserted and, if the selection signal SELk takes the logic value '0', the control signal BLKk is kept floating at the bootstrapped voltage Vpp, whereas, if the selection signal SELk takes the logic value '1', the node 215 is discharged to ground.

The value taken by the test selection signal TSTk is not relevant during a read or a write operation.

Thanks to the row decoder according to this embodiment of the present invention the gate terminals of the pass transistors are not left floating during a DMA phase requiring a time period relatively long and, then, they do not undergo any discharge from the reached high voltage. Accordingly, a relatively long duration of a DMA operation on the flash memory is not a limit for the reliability of the results of a test on the flash memory. Thus, a DMA operation, typically having duration of the order of tens of milliseconds, can be performed for identifying defective memory cells and for obtaining the threshold voltage distribution in the flash memory.

In addition, it has to be pointed out that a reliable row decoder according to this embodiment of the present invention can be implemented without impacting on the compactness of the NAND memories and, particularly, maintaining an architecture of the row decoder providing global lines for saving occupied area. Particularly, the row decoder according to the embodiment of the present invention herein described includes only two additional pass transistors and a NOT logic port with respect to the solutions known in the art.

Although the present invention has been disclosed and described by way of an embodiment, it is apparent to those skilled in the art that several modifications to the described embodiment, as well as other embodiments of the present invention are possible without departing from the scope thereof as defined in the appended claims.

For example, the number of bit lines and word lines as well as the size of the memory block may greatly vary, not being a limitation for the present invention. Furthermore, a different number of pass transistors can be used or also different switching devices can be exploited in place of n-MOS transistors acting as pass transistors. The precharge control units can be implemented in a different way, particularly with another number or type of logic gates.

Although described making reference to a DMA operation, the invention can be applied in general whenever an operation necessitates relatively long times, during which the select lines and the word lines of the selected block should be kept driven by the row decoder, particularly times longer than typical times required by read and write operations.

From the foregoing it will be appreciated that, although specific embodiments of the invention have been described herein for purposes of illustration, various modifications may be made without deviating from the spirit and scope of the invention.

The invention claimed is:

1. A row decoder for an electrically programmable NAND memory including an array of a plurality of memory cells arranged in a plurality of rows, said memory cells being grouped into a plurality of memory blocks each one including a plurality of strings of memory cells, and each string including at least one access element for coupling the string to a respective bit line, the access elements of the strings of a respective memory block being controlled by a respective select line, the row decoder including:
   a global select line selectively couplable to the select line corresponding to an addressed memory block;
   switching means for each memory block for selectively coupling the global select line to the select line, the switching means having a respective control node; and
   precharging means for precharging to a select voltage the control nodes, the precharging means being activatable in a testing operation for precharging all the control nodes to the select voltage adapted to cause the coupling of the global select line to the select lines,
wherein the row decoder further includes:
   first means for keeping at least the control node of the addressed memory block charged at said select voltage;
   second means for decoupling all the select lines from the global select line; and
   third means for providing an access voltage to the select line corresponding to the addressed memory block for enabling the respective access elements and for providing an access inhibition voltage to the select lines corresponding to the non-addressed memory block, the first, second and third means being activatable in the testing operation.

2. The row decoder according to claim 1, wherein the testing operation is an operation requiring an activation time of the switching means longer than a typical activation time during read or write operations.

3. The row decoder according to claim 2, wherein the testing operation is an operation of direct memory access to a memory cell.

4. The row decoder according to claim 1, including an address decoder for decoding a memory block address corresponding to a desired memory block and for generating a memory block select signal for each memory block, wherein the third means are adapted to exploiting the memory block selection signals for providing the access voltage and the access inhibition voltage.

5. The row decoder according to claim 4, wherein the third means includes means activatable in the direct memory access operation are adapted to deriving said access voltage and said access inhibition voltage from the memory block select signals.

6. The row decoder according to claim 1, wherein the third means includes means for selectively coupling the select signal with the select line.

7. In an electrically programmable NAND memory including an array of a plurality of memory cells arranged in a plurality of rows, said memory cells being grouped into a plurality of memory blocks each one including a plurality of strings of memory cells, and each string including at least one access element for coupling the string to a respective bit line, the access elements of the strings of a respective memory block being controlled by a respective select line, a global select line selectively couplable to the select line corresponding to an addressed memory block, switching means for each memory block for selectively coupling the global select line to the select line, the switching means having a respective control node, and means for precharging to a select voltage the control nodes,
  a method of testing a memory cell including precharging all the control nodes to the select voltage adapted to cause the coupling of the global select line to the select line,
wherein the method further includes:
  keeping at least the control node of the addressed memory block charged at said selection voltage;
  decoupling all the select lines from the global select line;
  providing an access voltage to the select line corresponding to the addressed memory block for enabling the respective access elements; and
  providing an access inhibition voltage to the select lines corresponding to the non-addressed memory block.

8. The method according to claim 7, including an operation requiring an activation time of the switching means longer than a typical activation time during read or write operations.

9. The method according to claim 8, including an operation of direct memory access to a memory cell.

10. The method according to claim 7, further including:
  decoding a memory block address corresponding to a desired memory block; and
  generating a memory block select signal for each memory block, wherein said providing the access voltage and the access inhibition voltage comprises exploiting the memory block selection signals.

11. The method according to claim 7, wherein the memory block selection signal corresponding to an addressed memory block takes the value of the access voltage and the memory block selection signal corresponding to a not-addressed memory block takes the value of the access inhibition voltage.

12. A row decoder for an electrically programmable NAND memory including an array of memory cells arranged rows and columns, each memory cell in a given column being associated with a corresponding bit line and the memory cells being grouped into a plurality of memory blocks, each block including a plurality of strings of memory cells with each string including a plurality of memory cells associated with the corresponding bit line and at least one access element for coupling the string to the bit line, each access element of each string being adapted to receive a respective select signal from the row decoder, the row decoder comprising:
  a plurality of first pass switching circuits, each first pass switching circuit being associated with a corresponding memory block and each pass switching circuit having a control node adapted to receive a block enable signal, an output node coupled to the access elements of the strings in the block, and having an input node;
  a plurality of second pass switching circuits, each second pass switching circuit being associated with a corresponding memory block and having a control node adapted to receive an enable signal, an output node coupled to input node of the corresponding first pass switching circuit, and having an input node adapted to receive a global selection signal;
  a plurality of third pass switching circuits, each third pass switching circuit being associated with a corresponding memory block and having a control node adapted to receive a test mode enable signal, an output node coupled to input node of the corresponding first pass switching circuit, and having an input node adapted to receive a test activation signal; and
  a plurality of precharge control circuits, each precharge control circuit being associated with a corresponding memory block and adapted to receive a corresponding block selection signal and to receive a precharge signal and a discharge signal, and each precharge control circuit coupled to the control node of the corresponding first pass switching circuit to apply the block enable signal, coupled to the input node of the corresponding third pass switching circuit to apply the test activation signal.

13. The row decoder of claim 12 wherein each of the pass switching circuits comprises an NMOS transistor.

14. The row decoder of claim 12 further comprising a word line decoder coupled to the input nodes of the second pass switching circuits and adapted to receive a row portion of an input address, and the row decoder operable to decode the row portion and activate global word line signals applied to the blocks of memory cells responsive to the decoded row portion and operable to active the global selection signal applied to second pass switching circuits.

15. The row decoder of claim 14 further comprising a block decoder coupled to each of the precharge control circuits and the block decoder adapted to receive a block portion of the input address and wherein the block decoder activates the block selection signal applied to the one of the precharge control circuits corresponding to block portion of the input address.

16. The row decoder of claim 12 wherein the test mode enable signal is activate during a DMA test mode of operation of the decoder.

17. An electronic device, comprising:
  an electronic subsystem including an electrically programmable NAND memory including an array of memory cells arranged rows and columns, each memory cell in a given column being associated with a corresponding bit line and the memory cells being grouped into a plurality of memory blocks, each block including a plurality of strings of memory cells with each string including a plurality of memory cells associated with the corresponding bit line and at least one access element for coupling the string to the bit line, each access element of each string being adapted to receive a respective select signal from the row decoder;
  a row decoder including, a plurality of first pass switching circuits, each first pass switching circuit being associated with a corresponding memory block and each pass switching circuit having a control node adapted to receive a block enable signal, an output node coupled to the access elements of the strings in the block, and having an input node;

a plurality of second pass switching circuits, each second pass switching circuit being associated with a corresponding memory block and having a control node adapted to receive an enable signal, an output node coupled to input node of the corresponding first pass switching circuit, and having an input node adapted to receive a global selection signal;

a plurality of third pass switching circuits, each third pass switching circuit being associated with a corresponding memory block and having a control node adapted to receive a test mode enable signal, an output node coupled to input node of the corresponding first pass switching circuit, and having an input node adapted to receive a test activation signal; and a plurality of precharge control circuits, each precharge control circuit being associated with a corresponding memory block and adapted to receive a corresponding block selection signal and to receive a precharge signal and a discharge signal, and each precharge control circuit coupled to the control node of the corresponding first pass switching circuit to apply the block enable signal, coupled to the input node of the corresponding third pass switching circuit to apply the test activation signal.

18. The electronic device of claim 17 wherein the electronic subsystem comprises a digital camera.

19. A method of testing memory cells in an electrically programmable NAND memory including an array of memory cells arranged rows and columns, each memory cell in a given column being associated with a corresponding bit line and the memory cells being grouped into a plurality of memory blocks, each block including a plurality of strings of memory cells with each string including a plurality of memory cells associated with the corresponding bit line and at least one access element for coupling the string to the bit line, each access element of each string being adapted to receive a respective select signal on an input node, and including a pass circuit coupled to the input node of each access element and having control nodes, the method comprising:

precharging the control nodes of all pass circuits to a select voltage adapted to cause the coupling of a global select signal to the input node of each access element;

driving at least the control node of the pass circuit associated with an addressed memory block at the select voltage;

isolating all the select lines from receiving the global select signal;

providing an access voltage through the pass circuit corresponding to the addressed memory block to the select line for enabling the respective access elements in that block; and providing an access inhibition voltage through the pass circuits for all non-addressed memory blocks to the select lines for these non-addressed memory blocks.

20. The method of claim 19 wherein driving at least the control node of the pass circuit associated with an addressed memory block at the select voltage occurs for a time longer than is required during normal read and write operations of the memory.

\* \* \* \* \*